United States Patent [19]

Cote et al.

[11] Patent Number: 5,262,354
[45] Date of Patent: Nov. 16, 1993

[54] REFRACTORY METAL CAPPED LOW RESISTIVITY METAL CONDUCTOR LINES AND VIAS

[75] Inventors: William J. Cote, Poughquag, N.Y.; Pei-Ing P. Lee, Williston, Vt.; Thomas E. Sandwick, Hopewell Junction, N.Y.; Bernd M. Vollmer, Wappingers Falls, N.Y.; Victor Vynorius, Pleasant Valley, N.Y.; Stuart H. Wolff, Tulsa, Okla.

[73] Assignee: International Business Machines Corporation, Armonk, N.Y.

[21] Appl. No.: 841,693

[22] Filed: Feb. 26, 1992

[51] Int. Cl.$^5$ .............................. H01L 21/44; H01L 21/48
[52] U.S. Cl. ..................................... 437/195; 437/189; 437/190; 437/192; 437/194
[58] Field of Search ........................... 437/195, 67, 41; 156/644, 643

[56] References Cited

U.S. PATENT DOCUMENTS

| | | | |
|---|---|---|---|
| 4,090,006 | 5/1978 | Havas et al. | 437/195 |
| 4,339,305 | 7/1982 | Jones . | |
| 4,526,631 | 7/1985 | Silvestri et al. . | |
| 4,789,648 | 12/1988 | Chow et al. . | |
| 4,822,753 | 4/1989 | Pintchovski et al. . | |
| 4,824,544 | 4/1989 | Mikalesen et al. | 204/298.6 |
| 4,824,802 | 4/1989 | Brown et al. . | |
| 4,847,214 | 7/1989 | Robb et al. | 437/67 |
| 4,944,836 | 7/1990 | Beyer et al. . | |
| 4,956,313 | 9/1990 | Cote et al. . | |
| 4,992,135 | 2/1991 | Doan . | |

OTHER PUBLICATIONS

K. Y. Ahn et al., Enhanced Copper Metallurgy for Beol Application, IBM Technical Disclosure Bulletin, vol. 33, No. 5, Oct. 1990.
Dalton, Enhanced Selective Tungsten Encapsulation of TiW Capped Aluminum Interconnect, VMIC Conference, Jun. 12-13, 1990., pp. 289-282.
S. M. Rossnagel et al., Collimated Magnetron Sputter Deposition, J. Tec. Sci. Technol., vol. 9, No. 2, Mar.-/Apr. 1988.
K. Shiozaki et al., Low Resistive, High Aspect Ratio Via-Hole Filling System Completely Planarized by Selective W Deposition and Subsequent Etch-Back, Extended Abstracts of the 19th Conference on Solid State Devices and Materials, Tokyo, 1987, pp. 435-438.
J. E. Cronin et al., Process of Making Conductive Lines of Two Different Materials Within a Level of Wiring, IBM Disclosure, vol. 31. (Jul. 1988).
H. W. Huang et al., Refractory Contact Stud, IBM Technical Disclosure Bulletin, vol. 29, No. 11, Apr., 1987.

*Primary Examiner*—Olik Chaudhuri
*Assistant Examiner*—H. Jey Tsai
*Attorney, Agent, or Firm*—Whitham & Marhoefer

[57] ABSTRACT

Electrically conducting vias and lines are created by a three step process. First, a controlled amount of a soft, low resistivity metal (12) is deposited in a trench or hole to a point below the top surface of the dielectric (10) in which the trench or hole is formed. Subsequently, the low resistivity metal (12) is overcoated with a hard metal (16) such as CVD tungsten. Finally, chemical-mechanical polishing is used to planarize the structure. The hard metal (16) serves the function of protecting the low resistivity metal (12) from scratches and corrosion which would ordinarily be encountered if the low resistivity metal were subjected to the harsh chemical-mechanical polishing slurries. An ideal method for partially filling trenches or holes in a substrate is by sputtering at elevated temperatures such that metallization at the bottom of a trench or hole separates from metallization on a top surface adjacent the trench or hole. An etchback procedure may also be used to separate metallization in a trench or hole from metallization adjacent a trench or hole. Trenchs and holes may also be filled by selective deposition. In addition, trenches and holes may also be lined by a metal liner (18) prior to metallization (12) deposition which can serve as a diffusion barrier.

17 Claims, 3 Drawing Sheets

REFRACTORY METAL CAPPED LOW RESISTIVITY METAL CONDUCTOR LINES AND VIAS

BACKGROUND OF THE INVENTION

1. Field of the Invention

The present invention generally relates to the manufacture of electrical conductor lines and vias that interconnect circuits on substrates such as semiconductors and related packages and, more particularly, to manufacturing conductor lines and vias which have a soft, low resistivity metal capped by a hard, protective, refractory metal. The invention has particular application in submicron circuit manufacture.

2. Description of the Prior Art

Low resistivity metals such as aluminum and copper and their binary and ternary alloys have been widely explored as fine line interconnects in semiconductor manufacturing. Typical examples of fine line interconnect metals include $Al_xCu_y$, where the sum of x and y is equal to one and both x and y are greater than or equal to zero and less than or equal to one, ternary alloys such as Al-Pd-Cu and Al-Pd-Nb, Al-Cu-Si, and other similar low resistivity metal based alloys. Today's emphasis on scaling down line width dimensions in very large scale integrated (VLSI) circuitry manufacture has led to reliability problems including inadequate isolation, electromigration, and planarization.

The IBM Technical Disclosure Bulletin to Ahn et al., Vol. 33, No. 5, Oct. 1990, pages 217–218, discloses tungsten wrapped copper conductors and via holes fabricated by selective deposition using a mixture of $WF_6$ and $SiH_4$ in the presence of hydrogen. Encapsulated interconnects like those of Ahn et al. have significantly higher resistance to electromigration and the small grain size of a selective tungsten film reduces reflectance and thereby enhances the ability of photolithography tools to focus and resolve photoresist images. However, the tungsten layer formed using the low temperatures described by Ahn et al. would be silicon rich (e.g., 3-4%) and would not be a good diffusion barrier for copper since copper resistivity would be degraded by the formation of copper silicide. Thus, it is difficult to deposit a diffusion barrier by selective means at low temperature. Moreover, the Ahn et al. technique relies on the formation of a donut shape at the bottom of the lines which is normally created by the reaction of outgassing moisture and $WF_6$. The creation of the donut shape is believed to be not reliable.

Dalton et al., VMIC Conference, Jun. 12-13, 1990, pages 289-292, points out that a hot wall chemical vapor deposition (CVD) reaction involving $SiH_4$ and $H_2$ reduction of $WF_6$ to form a selective tungsten layer on an aluminum or alloy conductor results in the incorporation of fluorine at the aluminum and tungsten interface. The fluorine incorporation is a byproduct of the reaction of $WF_6$ with aluminum as shown by Equation 1.

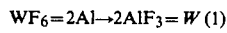

$$WF_6 = 2Al \rightarrow 2AlF_3 = W \quad (1)$$

The thin layer of aluminum fluoride will increase the series contact resistance of Metal 1 to Metal 2 vias. Dalton reported that sputtering TiW film on top of the aluminum prior to tungsten encapsulation using CVD eliminates the problem of fluorine absorption.

Dalton discloses a traditional scheme for interconnect formation wherein aluminum is first deposited on a planar surface, it is overcoated with the sputtered TiW layer (the only difference from traditional processing), the aluminum is then patterned using photoresist imaging and developing followed by reactive ion etching (RIE). The resulting structure is then overcoated with a passivation dielectric such as $SiO_2$ or polyimide which itself is subsequently patterned, subjected to RIE, and metallized to create a multilayered structure. FIG. 1 is taken from Dalton and shows that multilayer devices produced by traditional processing schemes have seams in the dielectric layers at the location of the metal conductor lines and have a very irregular top surface.

It is difficult to achieve planarity of the dielectric using RIE. Planarity is in part dependent on the pattern density, and non-planar surfaces result in puddling problems during subsequent metalization. If an RIE technique is used on polyimide, an etch stop is needed for removal of photoresist on top of aluminum or copper based lines when the lines are etched down to the polyimide surface because the photoresist removal process would also remove polyimide. RIE of any high copper content, aluminum or copper alloy is extremely difficult. A serious drawback of traditional processes which include metal RIE is that a large number of metal shorts tend to develop with fine geometry due to particle defects.

U.S. Pat. No. 4,824,802 to Brown et al. discloses a method for filling interlevel dielectric vias or contact holes in multilevel VLSI metalization structures. In particular, an intermediary metal such as tungsten or molybdenum is either selectively deposited in openings in an insulator or non-selectively deposited over the entire surface and in the openings of the insulator by CVD, then a planarization resist, such as azoquinonenovolac-type resists, polymethacrylates, polyimides, or other thermoplastic materials, is applied over the top of the intermediary metal. A planarized structure is then obtained by etching to a level where the intermediary metal is even with the resist. The Brown et al. method does not avoid metal corrosion and other problems associated with etching and is not useful for planarizing Al-Cu or other soft alloys because they have different properties from the harder metals such as tungsten and molybdenum. Moreover, using the Brown et al. method, it is difficult to completely fill vias and lines.

U.S. Pat. No. 4,944,836 to Beyer et al. discloses a chemical-mechanical polishing technique which can be used to produce coplanar metal/insulator films on a substrate. In particular, Beyer et al. contemplate patterning an underlying insulating layer, depositing an Al-Cu film, and then using a chemical-mechanical polishing technique wherein an alumina slurry in dilute nitric acid is mechanically rubbed on the surface to remove Al-Cu. The polishing compound tends to have a significantly higher removal rate for Al-Cu than the underlying insulator. The resulting structure includes Al-Cu lines planarized with the insulating layer, and subsequent layers can easily be added in the fabrication of multilayer structures.

U.S. Pat. No. 4,956,313 to Cote et al. discloses a via filling and planarization technique wherein Al-Cu alloy lines are patterned on top of a first passivation layer on a substrate, the lines are overcoated with a second passivation layer which is preferably a doped glass such as phosphosilicate glass (PSG) or borophosphosilicate glass (BPSG) which conforms over the contours of the Al-Cu alloy lines, vias are then formed in the second passivation layer to expose the lines, and tungsten is applied over the surface of the second passivation layer and in the vias by CVD. It is reported in Cote et al. that CVD tungsten is conformal in character and can fill the vias without creating voids. The structure is then planarized by polishing with an abrasive slurry.

Neither Beyer et al. nor Cote et al. recognize that polishing is not practical for low resistivity, soft metals such as Al-Cu alloys. This is because such materials tend to scratch, smear on the surface, and corrode under the influence of the slurry. Moreover, creation of the planarized structures in accordance with Cote et al. takes several processing steps which increases costs and reduces output.

Rossnagel et al. *J. Vac. Sci. Technol.* 2:261 (Mar./Apr. 1991) discloses a collimated magnetron sputter deposition technique for depositing films that are compatible with lift-off patterning techniques and hole filling. The technique is also presented in U.S. Pat. No. 4,824,544 which is herein incorporated by reference.

Shiozaki et al., *Abstracts of the 19th Conference on Solid State Devices and Materials*, discloses the use of selective tungsten deposition for hole filling on top of a high resistivity hard metal such as $MoSi_x$ and is unrelated to encapsulation of a soft metal.

SUMMARY OF THE INVENTION

It is an object of this invention to provide improved methods of creating damascene structures on semiconductor substrates.

It is an object of this invention to provide methods for fabricating damascene lines and vias on a substrate where the damascene lines or vias include both a low resistivity metal and a wear resistant, refractory metal, where the refractory metal serves a protective cap for the low resistivity metal.

It is another object of this invention to provide methods of making tungsten capped metal lines and vias.

It is yet another object of this invention to provide an improved method of partially filling a high aspect ratio trench or hole in a substrate.

According to the invention, conductive lines and vias comprised of a low resistance metal underlayer and a wear resistant, refractory metal overlayer are fabricated as planar, damascene structures without requiring cumbersome dielectric planarization steps. Scratching, overetch and corrosion problems associated with planarization by chemical-mechanical polishing are overcome by providing a relatively hard metal cap on top of a partially filled trench or via prior to polishing. Controlling the deposition temperature during collimated sputtering of soft metals such as aluminum into high aspect ratio holes or trenches in a substrate allows partially filled vias or lines with relatively flat top surfaces to be obtained. After deposition of the soft metal, the partially filled vias or trenches can then be overcoated by CVD refractory metal or other relatively hard metal. The CVD metal protects the underlying soft metal from scratching and corrosion which would otherwise result from chemical-mechanical polishing.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1:
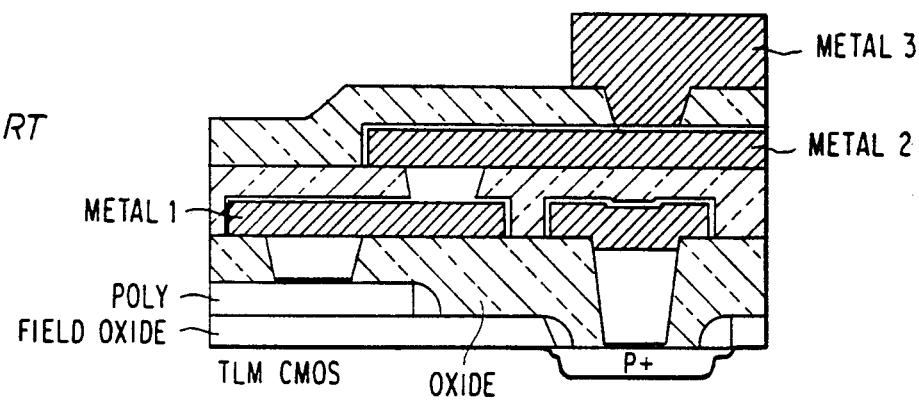
FIG. 1 is a cross-sectional side view of a prior art semiconductor subrate showing seams within the interlayer dielectrics and an uneven surface.
Figure 2A:
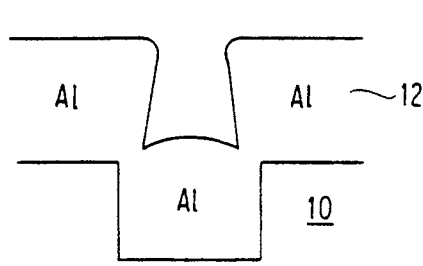
FIGS. 2a and 2b are sequential cross-sectional side views of a substrate showing the traditional steps used to fabricate damascene structures using chemical-mechanical polishing.
Figure 2B:
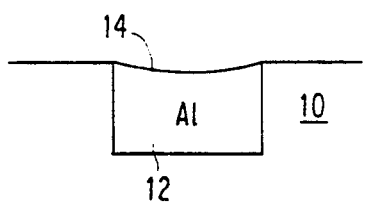

Referring now to the drawings and, more particularly to FIGS. 2a and 2b, there is illustrated the traditional method for creating a damascene line on a substrate. In particular, an opening in a dielectric 10 positioned on a substrate is overcoated with a metallization layer 12 which both fills the opening and coats over the top of the dielectric 10. The metallization layer 12 can be applied by CVD, sputtering, collimated sputtering, dipping, evaporating, or by other well known means. As will be discussed in greater detail below, when high aspect ratio, submicron interconnection lines are being formed, a collimated sputtering process is preferred for void free filling of the opening in the dielectric 10.

In very large scale integrated (VLSI) circuit applications, the dielectric 10 has several thousand openings which can be either vias or lateral metallization lines where the metallization pattern created serves to interconnect structures such as field effect transistors (FETs), bipolar transistors, Schottky diodes, or the like, formed on the substrate. The dielectric 10 can be inorganic layers such as silicon dioxide and silicon nitride, organic layers such as polyimide, or combinations of inorganic and organic layers. For VLSI circuits as well as other applications in which hundreds or thousands of lines or vias are used to interconnect hundreds or thousands of structures, the metallization 12 must be of the soft, low resistivity type including aluminum, copper, aluminum-copper alloys, ternary alloys such as Al-Pd-Cu and Al-Pd-Nb, Al-Cu-Si, and other similar low resistivity metal based alloys. High resistance metals could not be used in such applications as they would lead to heat generation and prevent proper performance of the interconnection function.

FIG. 2b shows that after deposition of the metallization layer 12, a chemical-mechanical polishing procedure can be used in an attempt to planarize the structure. As pointed above, U.S. Pat. No. 4,944,836 to Beyer et al., which is herein incorporated by reference, discloses that metallization can be removed from the surface of a dielectric by chemical-mechanical polishing with an alumina slurry in dilute nitric acid or by using other acidic slurries (e.g., ferric nitrate). Chemical-mechanical polishing has several advantages over RIE in terms of uniform metal removal and control of removal; however, the inventors have found a particular drawback of using a chemical-mechanical polishing slurry on aluminum, aluminum-copper alloys, or copper based metallization lines or vias, such as those indicated by metallization layer 12 in FIG. 2a, is that, as is best shown in FIG. 2b, the slurries are more selective for soft metal than dielectric removal and will have a tendency to remove too much from the top surface 14 of the metallization layer 12. A much more serious problem associated with chemical-mechanical polishing of soft, low resistivity metals such as aluminum-copper alloys is that there top surface 14 is easily scratched and corroded by the slurry which can lead to shorts and other problems.

This invention is particularly directed at solving the problem of scratching, corroding and over-etching a conductive line or via when chemical-mechanical polishing is desired to be used for planarizing a structure. It should be understood that the method can be used to planarize all kinds of substrates including lines and vias formed on silicon, gallium arsenide, and other materials which are suitable for making integrated circuits, as well as ceramics, glass, and composite materials commonly used for packaging semiconductors and for making thin film interconnections.

Figure 3A:
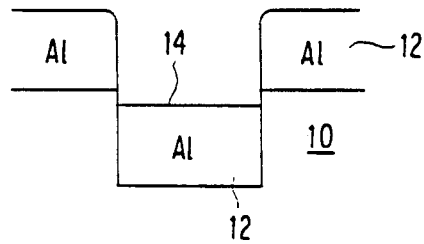
FIGS. 3a through 3c are sequential cross-sectional side views of a substrate showing the creation and use of the polish cap according to the present invention.
Figure 3B:
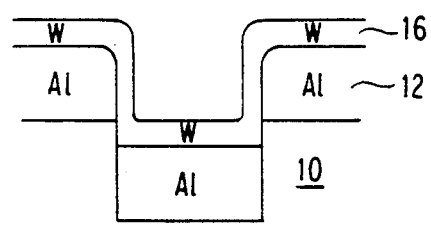
Figure 3C:
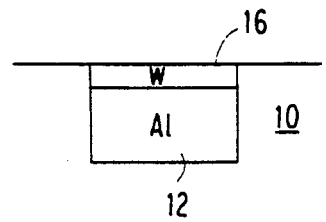

FIGS. 3a through 3c illustrate the improvement contemplated by this invention. In particular, a low resistance metallization layer 12 is deposited on a dielectric 10 so that it partially fills any openings in the dielectric 10 and overcoats the dielectric 10. As described above, deposition of the metallization layer 12 can be achieved by many well known procedures including CVD, sputtering, collimated sputtering, dipping, and evaporating. A very important aspect of the invention is that the metallization layer 12 is deposited in a controlled manner, such as by deposition time monitoring or the like, so that the top surface 14 of the metallization in the opening will be positioned below the top surface of the dielectric 10. Preferably, a great majority of the opening volume is filled with the metallization layer 12 (e.g., 90% or more) since the metallization layer 12 is a soft, low resistivity metal such as aluminum, copper, aluminum-copper alloys, as well as ternary alloys and multicomponent systems including elements such as aluminum and copper, and will fulfill the function of interconnecting the many structures on the substrate. In many applications, the opening in the dielectric 10 will be filled with metallization to a level on the order of a few hundred Angstroms to a few hundred nanometers below the top surface of the dielectric. Subsequently, as is best shown in FIG. 3b, a hard metal layer 16, such as a refractory metal (e.g., tungsten, titanium, tantalum, and alloys or compounds such as TiN), is deposited over the low resistivity metallization 12. Deposition of the refractory metal layer 16 can be achieved using CVD, plating, or other techniques. As is best shown in FIG. 3c, providing the hard metal layer 16 allows chemical-mechanical polishing techniques with slurries such as alumina in ferric nitrate or the like to be used to planarize the structure. The hard metal layer 16 serves as a cap which protects the underlying, soft, low resistance metallization 12 from scratching or corroding during chemical-mechanical polishing. An additional benefit of the refractory metal 16 cap is that it reduces electromigration. Refractory metals are hard and wear resistant; however, they have high resistivity. Therefore, as is pointed out above, it is preferable that the low resistivity metallization 12 fills the majority of the trench or via and that only a minimal amount of hard metal 16 caps the trench or via.

A particularly preferred method for partially filling high aspect ratio, submicron holes is by collimated sputtering. The aspect ratio generally refers to the ratio of the height of a trench or via relative to its width in the case of a trench or its diameter in the case of a via. Trenches and vias with aspect ratios greater than two are generally considered to have a high aspect ratio. An example of the use of a collimator to deposit sputtered material (copper) is given in a presentation by S. M. Rossnagel et al., "Lift-Off Magnetron Sputter Deposition," *American Vacuum Society 36th National Symposium, Boston Mass.*, Oct. 23-27, 1989, Final Program, p. 286 (copper deposited on lift-off structures to eliminate sidewall depositions) and in Rossnagel's U.S. Pat. No. 4,824,544, which is herein incorporated by reference. In brief, a collimator consists of a thin plate of steel or other material which does not deform under elevated temperatures and which has a plurality of apertures arranged in a honeycomb pattern through which atoms of material to be deposited are passed. It has been discovered that controlling the temperature of the collimator can have profound effects on the manner in which metals are deposited by collimated sputtering.

Figure 4A:
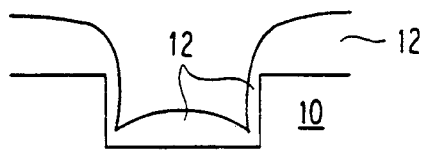
FIGS. 4a through 4c are cross-sectional side views of a substrate showing the effects of temperature on deposition.
Figure 4B:
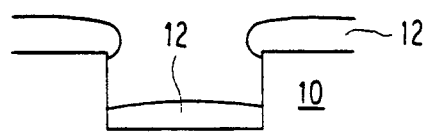
Figure 4C:
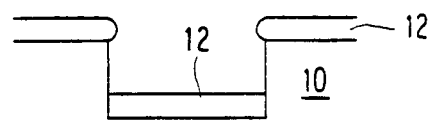

FIGS. 4a through 4c are cross-sectional side views of several substrates illustrating the results of experimental deposition of aluminum wherein a collimator having an aspect ratio of 0.7:1 (collimator thickness:hole diameter) was used at different sputter deposition temperatures (chuck temperatures). The results represented by FIGS. 4a through 4c were confirmed by scanning electron microscopy (SEM). With reference to FIG. 4a, when a deposition temperature of 100° C. was used, aluminum was visible on the side walls of an opening, there was thinning of the aluminum at the edges do to a shadowing effect from a slight aluminum overhang, and there was a bowing or hump in the metallization at the bottom of the opening. As the deposition temperature was increased, the aluminum fill improved. With reference to FIG. 4b, when a deposition temperature of 250° C. was used, there was a split in the aluminum at the bottom of the opening and the aluminum on the top surface. Nevertheless, there was some bowing of the aluminum at the bottom of the opening. With reference to FIG. 4c, when a deposition temperature of 400° C. was used, no aluminum was observed on the side walls and the bowing of the aluminum at the bottom of the opening was reduced to a minimum.

The results shown in FIGS. 4a through 4c can be explained by the fact that at higher temperatures, aluminum atoms have higher surface mobility. That is, the aluminum atoms are able to diffuse several hundred Angstroms across the surface before they lose their energy. The direction of the diffusion is determined by the effect of minimizing the aluminum surface energy. As a result, all aluminum at the sidewalls diffuses either to the top aluminum film or to the aluminum in the trough (250° C. or 400° C.). The surface mobility of the sputtered aluminum is also affected by the substrate on which the aluminum is sputtered. In the results illustrated by FIGS. 4a through 4c, titanium was used as the substrate; however, increased mobility has been observed using titanium nitride films. The deposition temperature dependence illustrated by FIGS. 4a through 4c would be expected with other metals or alloys and with and without sputtering.

Figure 5A:
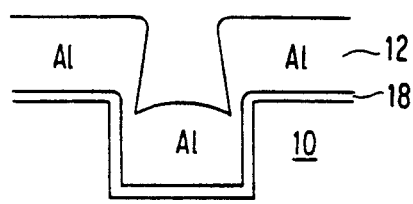
FIGS. 5a and 5b are sequential cross-sectional side views of a substrate showing a two step process for filling a trench or via with a low resistance metallization to a point just below the surface of a dielectric layer.
Figure 5B:
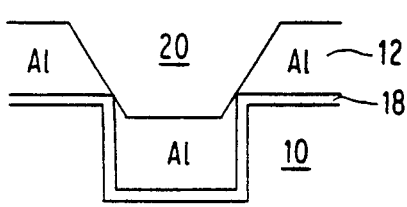
Figure 6:
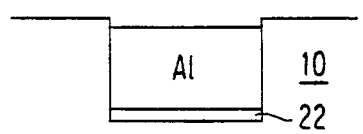
FIG. 6 is a cross-sectional side view of a semiconductor substrate showing another process for filling a trench or via with a low resistance metallization to a point just below the surface of a dielectric layer.

FIGS. 5A and 5B and FIG. 6 illustrate alternative procedures to those shown in FIGS. 3a, 4b and 4c, for producing a structure with a low resistivity metallization 12 located within an opening in a dielectric layer 10 on a substrate.

FIG. 5a shows that the dielectric 10 can first be lined with a thin coating of a refractory metal 18 such as titanium, tungsten, tantalum and various alloys such as TiW or TiN. Lining the dielectric 10 with a refractory metal 18 can be especially important if the metallization 12 is a copper based material since the refractory metal 18 would act as a diffusion barrier for the copper. The refractory metal liner 18 is preferably formed using collimated sputtering since that procedure can create uniform coatings in high aspect ratio openings. After the refractory metal liner 18 has been deposited, it is over coated with low resistivity metallization 12. As discussed above, the low resistivity metallization 12 can be aluminum, copper, aluminum-copper alloys, and can also be ternary alloys such as Al-Pd-Cu and multicomponent systems such as Al-Pd-Nb-Au. The low resistivity metallization 12 can be applied by collimated or non-collimated sputtering or by other well-known techniques. After applying the metallization layer 12, FIG. 5b shows that a sputter etch procedure, RIE, or the like is performed to remove all metallization 12 to the metal liner 18, as is indicated by trapezoidal gap 20. Removing the metallization layer 12 to the hard metal liner 18 is important since it establishes both that no metallization 12 in the opening of the dielectric 10 projects above the top surface of the dielectric 10 prior to refractory metal capping, and that during planarization by polishing, only the refractory metal cap is subjected to the chemical-mechanical polishing slurry. After the appropriate amount of metallization has been removed, the structure is overcoated by a hard metal (e.g., CVD tungsten) and is subsequently planarized using chemical-mechanical polishing as described above, whereby the hard metal deposited in the gap 20 will serve as a protective cap for the underlying metallization 12.

Figure 7A:
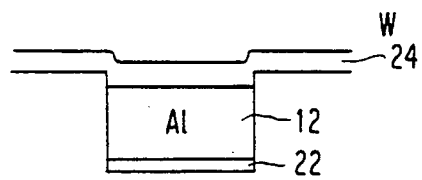
FIGS. 7a and 7b are cross-sectional side views of a substrate showing coating a partially filled trench or via with a hard, inert metal layer, followed by planarizing using chemical-mechanical polishing.
Figure 7B:
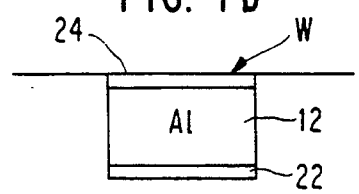

FIG. 6 illustrates a process wherein a refractory metal seed layer 22 is first provided in the opening in the dielectric 10 and, subsequently, low resistivity metallization 12 (e.g., aluminum, copper, aluminum-copper alloys, as well as other low resistivity metals or alloys) is deposited selectively in the opening. One method for selective deposition of the metallization 12 is by growing up from the seed layer 22. The appropriate level of growth can be achieved through time control and by other means. Other methods of selective deposition may also be used. The refractory metal seed layer 22 may be titanium, TiW, TiN, and other refractory alloys, and can be provided by sputtering, evaporation and other techniques. The seed layer 22 may also serve as a diffusion barrier in the ultimate structure produced. FIGS. 7a and 7b respectively show that a conformal capping layer 24, such as tungsten or other hard or refractory metals, is first provided over the low resistivity metallization 12, and then the structure is planarized via chemical-mechanical polishing. The metal capping layer 24 is wear resistant and enables chemical-mechanical polishing to proceed smoothly without scratching or corroding the underlying soft, low resistivity metallization 12. Furthermore, the metal capping layer 24 reduces problems associated with electromigration.

Figure 8A:
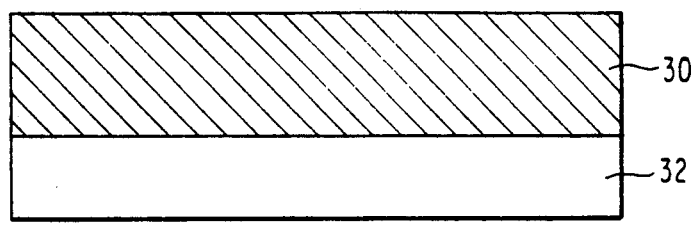
FIGS. 8a through 8e are cross-sectional side views of a substrate showing a process for using the inventive capping technique on multilevel structures.
Figure 8B:
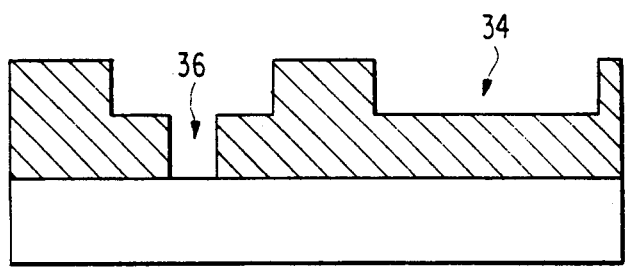
Figure 8C:
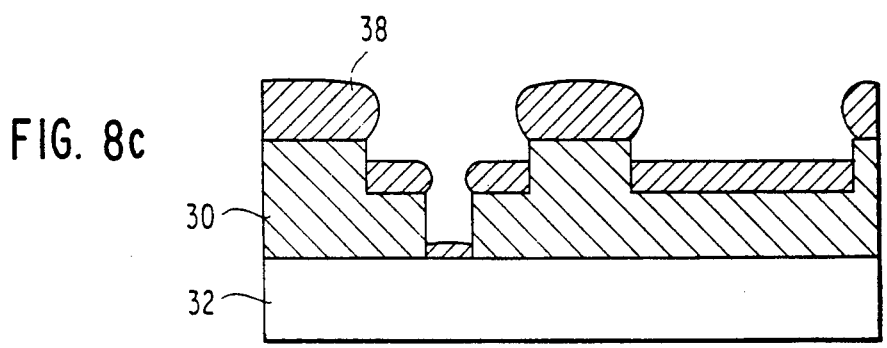
Figure 8D:
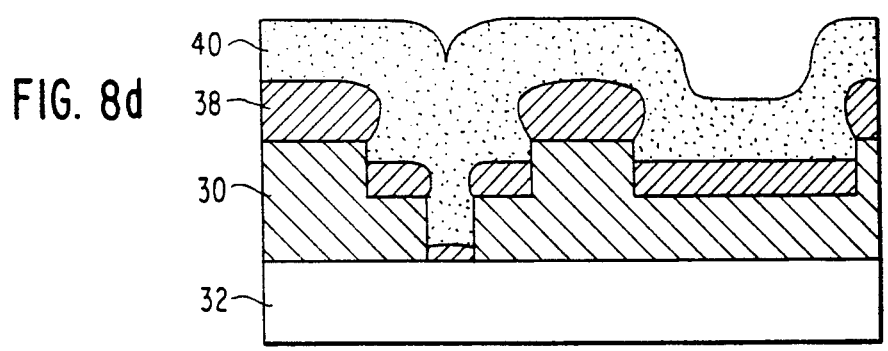
Figure 8E:
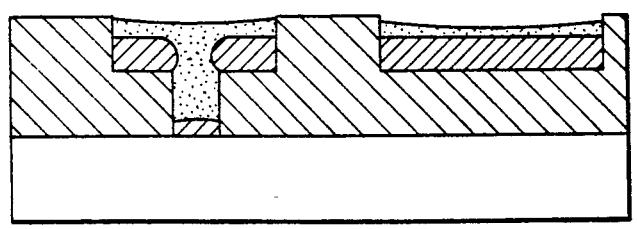

It is anticipated that the capping and polishing technique will be used in 64 megabit DRAM chips and other VLSI devices. FIGS. 8a–e show that the capping and polishing technique can be used in the manufacture of multilevel devices. FIG. 8a shows a dielectric layer 30 formed on a substrate 32. As discussed above, the dielectric layer can be either an inorganic material such as $SiO_2$ grown or deposited on the substrate 32, silicon nitride, or glasses such as PSG or BPSG, or an organic material such as a polyimide, or some combination of inorganic and organic materials. The substrate 32 can be a silicon chip or wafer, as well as a ceramic or chip packaging material. FIG. 8b shows that the dielectric layer 30 can be patterned to two or more levels. Patterning can be achieved using contrast enhanced lithography (CEL) or other suitable techniques. FIG. 8b shows that openings for metallization lines 34 and and for vias 36 can be provided. With reference to FIG. 8c, a low resistivity metallization 38 is then deposited on the multiple levels in the dielectric layer 30. As explained in conjunction with FIG. 5a and FIG. 6, a refractory metal liner or seed layer can be provided in the openings in the dielectric 30 prior to deposition of the low resistivity metallization 38. FIG. 8d shows that the entire structure is then overcoated with a layer of a hard metal 40, such as a refractory metal (preferably tungsten, titanium, tantalum or suitable alloys). The hard metal 40 can be applied by CVD or other techniques. In addition, an adhesion promoter such as TiN may be sputtered on prior to application of a refractory metal 40 by CVD. FIG. 8e shows that the entire structure is then planarized using chemical-mechanical polishing. The hard metal 40 protects the underlying low resistivity metallization 38 during the polishing procedure.

While the invention has been described in terms of its preferred embodiments, those skilled in the art will recognize that the invention can be practiced with modification within the spirit and scope of the appended claims.

Having thus described our invention, what we intend to claim by Letters Patent is as follows:

1. A method for producing capped damascene lines or vias on a substrate, comprising the steps of:
   depositing a soft metal or metal alloy having low resistance in a trench or hole in a substrate at a temperature sufficient to allow separation of said soft metal or metal alloy into a first portion deposited in said trench or hole and a second portion deposited on a surface of said substrate, said first portion being positioned below said surface of said substrate;
   depositing a hard metal or metal alloy which is more resistant to chemical-mechanical polishing than said soft metal or metal alloy over said soft metal or metal alloy; and
   polishing said substrate to planarize a line or a via created in said trench or said hole, respectively, with said surface of said substrate, whereby said hard metal or metal alloy protects said soft metal or metal alloy from scratching and corrosion during polishing.

2. A method as recited in claim 1 wherein said step of depositing said soft metal or metal alloy is achieved by sputtering.

3. A method as recited in claim 2 wherein said sputtering accompanied by collimation.

4. A method as recited in claim 2 wherein said temperature used in said step of depositing is greater than 100° C.

5. A method as recited in claim 1 further comprising the step of lining said trench or hole with a material which enhances a surface mobility of said soft metal or alloy deposited in said step of depositing said soft metal or alloy.

6. A method as recited in claim 1 wherein said temperature used in said step of depositing a soft metal or metal alloy having low resistance is greater than 100° C.

7. A method as recited in claim 1 wherein said temperature used in said step of depositing is chosen to substantially flatten a top surface of said first portion of said soft metal or alloy in said trench or hole.

8. A method as recited in claim 1 wherein said step of depositing said hard metal or metal alloy is performed by chemical vapor deposition.

9. A method as recited in claim 1 wherein said step of polishing is performed with an acid based chemical-mechanical polishing compound containing alumina.

10. A method as recited in claim 1 further comprising the step of lining said trench or hole with a material which acts as a diffusion barrier to said soft metal or alloy deposited in said step of depositing said soft metal or alloy.

11. A method as recited in claim 4 wherein said temperature used in said step of depositing is at least 400° C.

12. A method as recited in claim 1 wherein said step of depositing a soft metal or metal alloy having low resistance fills 90% or more of said trench or hole.

13. A method as recited in claim 1 wherein said step of depositing a soft metal or metal alloy having low resistance includes the step of separating a third portion of said soft metal or metal alloy from said first and second portions and depositing said third portion on an intermediate level in said trench.

14. A method for producing capped damascene lines or vias on a substrate, comprising the steps of:
   depositing a soft metal or metal alloy having low resistance over a substrate having at least one a trench or hole, said step of depositing filling said trench or hole to a point below a top surface of said substrate;
   removing any soft metal or metal alloy which connects a first portion of said soft metal or metal alloy in said trench or hole with a second portion of said soft metal or metal alloy on said top surface of said substrate;
   depositing a hard metal or metal alloy which is more resistant to chemical-mechanical polishing than said soft metal or metal alloy over said soft metal or metal alloy; and
   polishing said substrate to planarize a line or a via created in said trench or said hole, respectively, with said surface of said substrate, whereby said hard metal or metal alloy protects said soft metal or metal alloy from scratching and corrosion during polishing.

15. A method as recited in claim 14 wherein said step of removing is achieved by sputter etching.

16. A method for producing capped damascene lines or vias on a substrate comprising the steps of:
   depositing a refractory metal seed layer in a trench or hole in a substrate;
   selectively depositing a soft metal or metal alloy having low resistance on said metal seed layer, said step of selectively depositing filling said trench or hole to a point below a top surface of said substrate;
   depositing a hard metal or metal alloy which is more resistant to chemical-mechanical polishing than said soft metal or metal alloy over said soft metal or metal alloy; and
   polishing said substrate to planarize a line or a via created in said trench or said hole, respectively, with said surface of said substrate, whereby said hard metal or metal alloy protects said soft metal or metal alloy from scratching and corrosion during polishing.

17. A method as recited in claim 16 wherein said step of selectively depositing said soft metal or metal alloy is performed by growing.

* * * * *

UNITED STATES PATENT AND TRADEMARK OFFICE
CERTIFICATE OF CORRECTION

PATENT NO. : 5,262,354
DATED : November 16, 1993
INVENTOR(S) : William J. COTE et al.

It is certified that error appears in the above-indentified patent and that said Letters Patent is hereby corrected as shown below:

On the title page, please delete "Assignee: International Business Machines Corporation" and insert --Assignee: International Business Machines Corporation and Siemens Corporation--.

Signed and Sealed this

Thirty-first Day of May, 1994

Attest:

BRUCE LEHMAN

Attesting Officer      Commissioner of Patents and Trademarks